United States Patent [19]

Hiraoka et al.

[11] Patent Number: 4,828,874
[45] Date of Patent: May 9, 1989

[54] LASER SURFACE TREATMENT METHOD AND APPARATUS FOR PRACTICING SAME

[75] Inventors: Susumu Hiraoka, Kokubunji; Keizo Suzuki, Kodaira; Shigeru Nishimatsu, Kokubunji, all of Japan

[73] Assignee: Hitachi, Ltd., Tokyo, Japan

[21] Appl. No.: 46,166

[22] Filed: May 5, 1987

[30] Foreign Application Priority Data

May 9, 1986 [JP] Japan .................................. 61-104642

[51] Int. Cl.$^4$ ...................... B05D 3/06; C23C 14/00; C23F 1/02
[52] U.S. Cl. .................................... 427/53.1; 156/345; 156/643; 156/646; 156/662; 118/50.1; 118/722; 118/624
[58] Field of Search ...................... 427/53.1; 118/50.1, 118/624, 722, 724, 715; 156/345, 643, 646, 662

[56] References Cited

U.S. PATENT DOCUMENTS

| | | | |
|---|---|---|---|
| 4,260,649 | 4/1981 | Denison | 427/53.1 |
| 4,490,211 | 12/1984 | Chen et al. | 427/53.1 |
| 4,505,949 | 3/1985 | Jelks | 427/53.1 |
| 4,579,750 | 4/1986 | Bowen et al. | 427/53.1 |
| 4,581,248 | 4/1986 | Roche | 427/53.1 |
| 4,615,904 | 10/1986 | Ehrlch et al. | 427/53.1 |
| 4,649,059 | 3/1987 | Eden et al. | 427/53.1 |
| 4,668,304 | 5/1987 | Schachameyer et al. | 427/53.1 |
| 4,670,063 | 6/1987 | Schachameyer et al. | 427/53.1 |
| 4,685,976 | 8/1967 | Schachameyer et al. | 427/53.1 |
| 4,731,158 | 3/1988 | Brannon | 156/345 |

FOREIGN PATENT DOCUMENTS 0226918  10/1986  Japan .................................. 118/722

*Primary Examiner*—Shrive Beck
*Assistant Examiner*—M. L. Padgett
*Attorney, Agent, or Firm*—Antonelli, Terry & Wands

[57] ABSTRACT

A surface treatment method, wherein gas particles are applied to a solid surface of a substrate to treat the same surface, comprising the step of applying to the gas particles the narrow line width laser light capable of exciting or decomposing only such gas particles that have velocities in a predetermined range.

12 Claims, 1 Drawing Sheet

LASER SURFACE TREATMENT METHOD AND APPARATUS FOR PRACTICING SAME

BACKGROUND OF THE INVENTION

This invention relates to a solid surface treatment method and an apparatus for practicing the same, and more particularly to a surface treatment method used suitably for the manufacturing of semiconductor elements, capable of carrying out a damage- and contamination-free surface treatment operation at a low temperature, and having high reaction selectivity and anisotropy obtaining ability, and an apparatus for practicing this method.

The known dry surface treatment processes using light include:

(1) A method in which a beam of light is emitted in parallel with a substrate so as to excite gas particles alone.

(2) A method in which a beam of light is applied to a substrate so as to excite the surface thereof.

Since a conventional apparatus for practicing the method (1) employs a light source of a large line width, the speed and direction of movement of the gas particles to be excited cannot be limited. Accordingly, if this method is used, the gas particles having speeds in all directions are excited simultaneously. Therefore, this method cannot be used for a treatment for a surface that is required to be anisotropic. The examples of the techniques for treating a surface that is required to be anisotropic include the vertical etching used to transfer a fine mask pattern to a substrate.

In the method (2), the surface of a substrate is excited with the intense light, so that the reaction of the portion of the substrate upon which the light impinges is promoted. This enables the method to be used to treat a surface requiring to have anisotropy. However, while this method is used, troubles occur, i.e., the substrate is heated and damaged due to the intense light entering the surface thereof.

Thus, in the conventional techniques of this kind, the treating of a surface that is required to have anisotropy cannot be done without accompanying the heating and damaging of the substrate. The techniques relative to the surface treatment techniques of this kind are discussed in the "Applied Physics Letters" 35(2) (1979), pages 175–177.

In the conventional techniques mentioned above, no sufficient consideration is given to the coexistence of their capability of providing an object surface with anisotropy and their capability of obtaining the non-surface-damaging characteristics. In order to provide an object surface with anisotropy, it is necessary that the intense light be applied to the surface of a substrate. This causes the substrate surface to be damaged and heated.

SUMMARY OF THE INVENTION

An object of the present invention is to provide a surface treatment method capable of treating an object surface so that the surface is provided with high anisotropy, without applying the light to the same surface, or with the intensity of the incident light limited to a level at which the damage to the surface does not occur.

This object can be achieved by exciting or decomposing only such gas particles that have speeds within a predetermined range with the light of a narrow line width to thereby treat the surface of a substrate.

The gas particles move at various speeds, and the wavelengths of the light absorbed by the respective gas particles vary depending upon the speeds thereof. The speed referred to above is a vector having a direction. Let C equal the speed of the light, and $\lambda_O$ the wavelength of the light which is absorbed by the stationary gas particles. The wavelength of the light absorbed by a gas particle having a speed V in the direction of light propagation becomes as follows due to the Doppler effect.

$$\lambda = \frac{1}{1 - \frac{v}{c}} \lambda_0 \approx \left(1 + \frac{v}{c}\right)\lambda_0 \quad (1)$$

Namely, $$\lambda = \left(1 + \frac{v}{c}\right)\lambda_0$$

If the light of a specific wavelength $\lambda$ is applied to a substrate, only the gas particles that have the speed V in the direction of light propagation can be excited. (The gas particles having a speed in the direction of the light propagation of zero can be excited selectively, especially, with the light of a specific wavelength $\lambda = \lambda_O$.) Since it is difficult from a practical standpoint to obtain the light of a specific wavelength, the light of a narrow line width $\Delta\lambda$ is used. For example, if the light of a line width of FWHM (full width at half maximum) of $2 \times 10^{-6} \lambda_O$ is used, the following equation can be established for defining a narrow line width light as that term is used herein.

$$\frac{\Delta\lambda}{\lambda_0} = 2 \times 10^{-6}$$

In accordance with the equation (1), $\Delta V = 2 \times 10^{-6} \times C = 600$ m.s. Namely, the velocity distribution in the direction of light propagation of the gas particles to be excited can be set to both $-300$ m/s~300 m/s and 0~600 m/s by controlling the center wavelength.

According to the present invention, the speed and direction of movement of the excited gas particles are controlled by utilizing the Doppler effect and the light of a narrow line width as mentioned above. Consequently, a flow of excited gas particles having limited direction of movement and speed can be produced. Accordingly, treating a surface of a substrate so as to provide it with anisotropy can be done without applying the light thereto and by controlling the intensity of the light entering the surface to a level at which damage to the surface does not occur. Moreover, the reaction selectivity can be improved.

DESCRIPTION OF THE PREFERRED EMBODIMENTS

Figure 1:
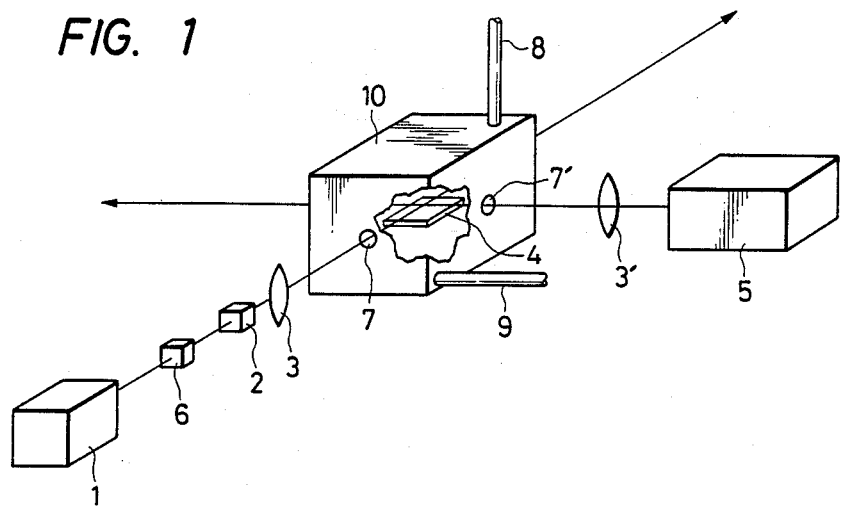
FIG. 1 is a construction diagram of an embodiment of the surface treatment apparatus according to the present invention.

An embodiment of the present invention will now be described with reference to the drawings. Referring to FIG. 1, a part of the narrow line width visible laser light emitted from a laser oscillator 1 is converted into second harmonics by a second harmonics generator 6, and an output from this generator 6 is used as narrow line width ultraviolet laser light. A filter 2 is adapted to pass the ultraviolet light alone therethrough. The narrow line width ultraviolet laser light is condensed by a lens 3 and passes through a space in the vicinity of a substrate 4, which is placed in a vacuum container 10, via a window 7 to be generally parallel with the surface of the substrate so that the light does not enter the substrate.

The narrow line width visible laser light emitted from a laser oscillator 5 enters the container 10 substantially in parallel with the surface of the substrate 4 via a lens 3' and a window 7' so as to cross the narrow line width ultraviolet laser light in a position in the vicinity of the surface of the substrate. The angle at which the narrow line width visible laser light and narrow line width ultraviolet laser light cross each other is not specially limited. However, if this angle is set to substantially a right angle, the efficiency of selection of a speed component, which will be described in the following paragraphs, can be improved.

The vacuum container 10 is provided with a gas introducing port 8 and a gas discharging port 9, and gas particles to be applied to the substrate 4 are introduced into the container 10. The gas particles are excited by the narrow line width visible laser light in the above-mentioned light-crossing region, and reach the intermediate condition. The resulting gas particles are then further excited by the narrow line width ultraviolet light to reach the active state. The wavelengths of the visible and ultraviolet laser light are set in advance so that the laser lights selectively excite the gas particles whose velocity projections in the respective directions of light propagation are in the vicinity of zero. The gas particles two-step excited and reaching the active state move in the substantially perpendicular direction with respect to the substrate and enter the same in the same direction.

Figure 2:
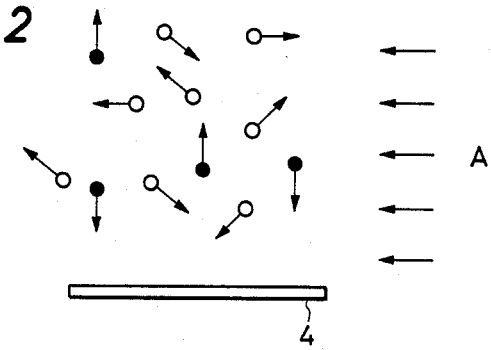
FIG. 2 illustrates the principle of the present invention.

The principles of this phenomenon will be described with reference to FIG. 2. Referring to FIG. 2, the shaded circles denote gas particles of which the speed components in the direction of light propagation are in the vicinity of zero, and clear circles gas particles of which the speed components in the mentioned direction are in the levels other than the levels in the vicinity of zero. Only the gas particles shown by the shaded circles out of the gas particles shown by the shaded and clear circles are excited to the intermediate state by the narrow line width visible laser light. As a result, the velocity of the gas particles excited to the intermediate state is limited in a plane substantially perpendicular to the surface of the drawing. If the narrow line width ultraviolet laser light is then applied to the gas particles in the direction perpendicular to the surface of the drawing, only the gas particles in the intermediate state in which the speed components in the direction perpendicular to the surface of the drawing are in the level in the vicinity of zero are excited in the same manner as mentioned above, to reach the active state. After all, the direction of movement of the gas particles which have reached the active state is restricted to the direction substantially perpendicular to the surface of the substrate.

This embodiment applied to the etching of polycrystal-line silicon using $Cl_2$ as gas particles will now be described. $Cl_2$ is excited to the intermediate state $B^3\pi$ $(Ou+)$ by the 500–520 nm visible laser light, and further excited by the 230–255 nm laser light to reach the $f(Og+)$ state. If dye lasers having a line width of 1 pm full width at half maximum are used as the laser oscillators 1, 5 in this embodiment, the distribution of velocity projections in the direction of the surface of the substrate of $Cl_2$ in $f(Og+)$ state produced becomes 600 m/s in full width at half maximum. Since the velocity projection in the direction perpendicular to the substrate surface of the $Cl_2$ molecules is not limited by the light, the full width at half maximum at a temperature of 1000 K. becomes 1600 m/s, and the $Cl_2$ molecules in the $f(Og+)$ state enter the substrate in the substantially perpendicular direction, so that the perpendicular etching can be done.

If the above-mentioned laser light crossing region is set in a position within a mean free path of the gas particles above the substrate, the anisotropy of the treated surface can, of course, be improved.

This embodiment has the following advantages.
1. The perpendicular etching of a substrate can be done.
2. Since the light does not enter the substrate, the surface thereof is not thermally damaged.
3. The local etching of the substrate can be done.
4. Since the gas particles are excited selectively by the light, the surface of the substrate is not contaminated and damaged by high-energy particles, and the reaction selectivity becomes high.

In this embodiment, the etching of a substrate is done by using $Cl_2$. The deposition of solid films and surface modification can also be done by changing the reaction gas and excitation wavelength. Also, excited gas particles which are to enter the substrate in the diagonal direction with respect thereto can be obtained by changing the wavelength of the laser light, and a surface treatment in the direction other than the perpendicular direction can be carried out.

Figure 3:
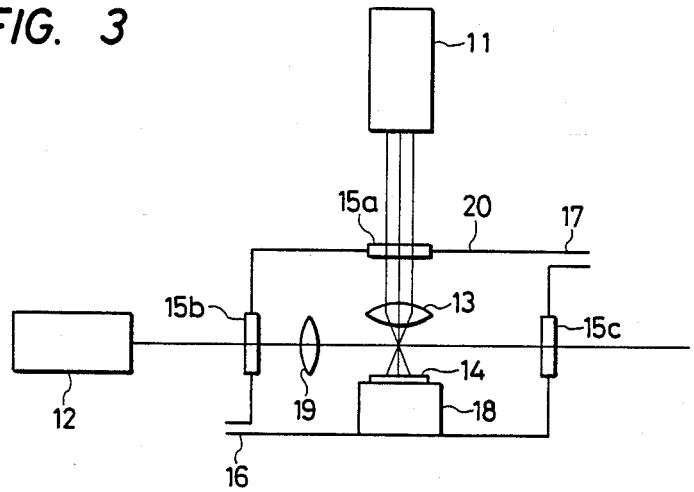
FIG. 3 is a construction diagram of another embodiment of the present invention.

FIG. 3 shows another embodiment of the present invention. The narrow line width laser light emitted from a laser oscilator 11 passes through a window 15a provided in a vacuum container 20, and is condensed by a lens 13 to enter a substrate 14, which is placed on a substrate base 18, in the substantially perpendicular direction. The infrared laser light emitted from a laser oscillator 12 is applied to the portion of the space in the container 20 which is in the vicinity of the surface of the substrate, through a window 15b and a lens 19 at an angle at which the laser light does not enter the substrate 14. Thus, the infrared laser light crosses the narrow line width laser light in a position in the vicinity of the substrate surface. The infrared laser light which has passed the substrate surface is discharged from a window 15c to the outside so as not to scatter in the container 20. The gas particles are introduced from a gas inlet port 16 into the container 20 and discharged from a gas discharge port 17. The molecules of a metal compound [for example, metal carbonyls, such as $W(CO)_6$ or $Mo(CO)_6$] are used as gas particles, and the wavelength of the infrared laser light is set in agreement with the oscillation energy intervals of the molecules in the excited state of the metal compound in use. While this embodiment is practiced, only the molecules of the metal compound that move down are excited by the narrow line width laser light. The excited molecules of metal compound are then subjected to the multiple photon dissociation by the infrared laser light to produce metal atoms. The velocity projection of the parent molecules is reflected on these metal atoms, which enter the substrate in the substantially perpendicular direction. As a result, a film is formed on only such a surface of the substrate that is parallel to the upper surface thereof.

In this embodiment, the narrow line width laser light is passed through a substrate surface, and a reaction in a gas is utilized. Accordingly, it is not necessary to apply intense light to the surface of the substrate. If the focus of the lens 13 is set on the intersection of the infrared laser light, a film can be formed on the substrate surface without any damage thereto.

In this embodiment, the infrared laser is used in addition to the narrow line width laser light so as to increase the reaction selectivity but the reaction can be generated by the narrow line width laser light alone. This embodiment can be used for the surface modification and etching by changing the gas particles. Moreover, if the incident angle of the narrow line width laser light with respect to a substrate is changed, both the forming of a film on a side surface extending in a predetermined direction of the substrate and the diagonal etching of the substrate can be done.

The above are the descriptions of the embodiments of the present invention using laser light. Even when the ordinary light, the wavelength of which is sufficiently restricted, is used, the same surface treatment operation can naturally be carried out.

According to the present invention, a flow of active gas particles, the direction of which is limited, can be generated. Therefore, an operation for treating a surface of a substrate so as to provide it with high anisotropy can be carried out without applying the light to the surface or with the intensity of the incident light limited to a level at which the surface is not damaged by the light. The present invention is also capable of improving the reaction selectivity.

What is claimed is:

1. A surface treatment method for treating a surface of a substrate by applying gas particles thereto, comprising the steps of setting the substrate in gas atmosphere, irradiating the gas particles with a narrow line width light that can be absorbed only by such gas particles that have velocity vectors in a predetermined range so that the gas particles are excited or decomposed thereby, said narrow line light having a line width $\alpha\lambda \leq 2 \times 10^{-6} \lambda$ where $\lambda$ is the center wave length of said light, and treating the substrate with the excited or decomposed gas particles.

2. A surface treatment method according to claim 1, wherein said narrow line width light is laser light.

3. A surface treatment method according to claim 2, wherein said narrow line width laser light is emitted from two positions so that the laser lights cross each other in a region in the vicinity of said substrate, and the wavelengths of the laser lights are set in advance so that the laser lights selectively excite the gas particles whose velocity projections in the respective directions of light propagation are in the vicinity of zero, to thereby subject gas particles that have same direction of velocity vectors to multi-step optical excitation of optical decomposition in said laser light-crossing region, the excited or decomposed particles being used to treat the surface of said substrate.

4. A surface treatment method according to claim 2, wherein said narrow line width laser light is applied to said substrate.

5. A surface treatment method according to claim 4, wherein second light is applied to said gas particles so that the second light crosses said narrow line width laser light without entering the surface of said substrate.

6. A surface treatment method for treating a surface of a substrate to be anisotropic while incident light to said surface is below a level at which damage to the surface occurs by applying gas particles thereto, comprising the steps of: placing the substrate in gas atmosphere; irradiating the gas particles with a narrow line width light that can be absorbed only by those gas particles that have velocity vectors in a predetermined range so that the gas particles are excited or decomposed thereby, said narrow line light having a line width $\Delta\lambda \leq 2 \times 10^{-6} \lambda$ where $\lambda$ is the center wave length of said light, said irradiation occurring at a position within a mean free path of the gas particles above the substrate surface being treated, and treating the substrate with the excited or decomposed gas particles to cause perpendicular etching of the substrate surface without contamination by high-energy particles.

7. A surface treatment apparatus used to treat a solid surface of a substrate by applying gas particles thereto, comprising:
a container holding gas particles therein and set at the interior thereof to a low pressure;
a base disposed in said container and holding thereon a substrate to be treated;
means for applying to said gas particles a narrow line width laser light capable of exciting or decomposing only such gas particles that have velocities in a predetermined range, said narrow line light having a line width $\Delta\lambda \leq 2 \times 10^{-6} \lambda$ where $\lambda$ is the center wave length of said light, said means including two laser oscillators adapted to emit said narrow line width laser light positioned so that the narrow line width laser light emitted come from in two directions and cross each other at a position in the vicinity of said substrate so as to be applied to said gas particles, said irradiation occurring at a position within a mean free path of the gas particles above the substrate surfaces being treated to cause perpendicular etching of the substrate without contamination by high-energy particles.

8. A surface treatment apparatus used to treat a solid surface of a substrate by applying gas particles thereto, comprising a container holding gas particles therein and set at the interior thereof to a low pressure, a base disposed in said container and holding thereon a substrate to be treated, and means for applying to said gas particles a narrow line width light capable of exciting or decomposing only such gas particles that have velocities in a predetermined range, said narrow line light having a line width $\Delta\lambda \leq 2 \times 10^{-6} \lambda$ where $\lambda$ is the center wave length of said light.

9. A surface treatment apparatus according according to claim 8, wherein said light consists of narrow line width laser light.

10. A surface treatment apparatus according to claim 9, wherein two laser oscillators adapted to emit said narrow line width laser light are provided, and the wavelength of the laser lights are set in advance so that the laser lights selectively excite the gas particles whose velocity projections in the respective directions of light propagation are in the vicinity of zero, so that the narrow line width laser light emitted therefrom in two directions cross each other in a position in the vicinity of said substrate so as to be applied to said gas particles.

11. A surface treatment apparatus according to claim 9, wherein said laser light-emitting means are disposed so that said narrow line width laser light is applied to said substrate.

12. A surface treatment apparatus according to claim 11, wherein said apparatus includes a means for applying second light to said gas particles, which second light is emitted so as not to enter the surface of said substrate and so as to cross said narrow line width laser light.

* * * * *